(12) United States Patent
Jeong

(10) Patent No.: US 10,204,675 B2
(45) Date of Patent: Feb. 12, 2019

(54) SEMICONDUCTOR MEMORY APPARATUS

(71) Applicant: SK hynix Inc., Icheon-si, Gyeonggi-do (KR)

(72) Inventor: Sang Hoon Jeong, Yeoju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/701,682

(22) Filed: Sep. 12, 2017

(65) Prior Publication Data

US 2018/0114563 A1    Apr. 26, 2018

(30) Foreign Application Priority Data

Oct. 26, 2016    (KR) .................. 10-2016-0140347

(51) Int. Cl.
| | |
|---|---|
| *G11C 7/06* | (2006.01) |
| *G11C 7/08* | (2006.01) |
| *G11C 5/06* | (2006.01) |
| *G11C 11/4091* | (2006.01) |
| *G11C 5/14* | (2006.01) |
| *G11C 7/10* | (2006.01) |
| *G11C 7/12* | (2006.01) |
| *G11C 16/26* | (2006.01) |

(52) U.S. Cl.
CPC .......... *G11C 11/4091* (2013.01); *G11C 5/147* (2013.01); *G11C 7/06* (2013.01); *G11C 7/08* (2013.01); *G11C 7/1048* (2013.01); *G11C 7/12* (2013.01); *G11C 16/26* (2013.01); *G11C 2207/005* (2013.01); *G11C 2207/063* (2013.01); *G11C 2207/065* (2013.01)

(58) Field of Classification Search
CPC ....... G11C 11/4091; G11C 5/147; G11C 7/06; G11C 7/08; G11C 7/1048; G11C 7/12; G11C 2207/063; G11C 2207/065
USPC .......................................................... 365/208
See application file for complete search history.

(56) References Cited

U.S. PATENT DOCUMENTS

| | | | | |
|---|---|---|---|---|
| 5,661,690 | A * | 8/1997 | Roohparvar ........... | G11C 29/02 365/185.2 |
| 8,830,768 | B2 * | 9/2014 | Kim ........................ | G11C 7/02 365/105 |
| 9,972,366 | B2 * | 5/2018 | Kang .................. | G11C 11/1655 |
| 2014/0029334 | A1 * | 1/2014 | Katti ...................... | G11C 11/16 365/158 |
| 2018/0151204 | A1 * | 5/2018 | Hong ................... | G11C 7/1063 |

FOREIGN PATENT DOCUMENTS

KR    1020030075960 A    9/2003

* cited by examiner

*Primary Examiner* — Ly D Pham
(74) *Attorney, Agent, or Firm* — William Park & Associates Ltd.

(57) ABSTRACT

A semiconductor memory apparatus of the technology includes a current sink circuit configured to allow a portion of a current flowing through a memory cell to flow to a negative voltage terminal in a read operation and a sense amplifier configured to detect data of the memory cell and a detection result in response to a sense amplifier enable signal in the read operation. The current sink circuit varies an amount of the current flowing to the negative voltage terminal in response to the sense amplifier enable signal.

10 Claims, 2 Drawing Sheets

SEMICONDUCTOR MEMORY APPARATUS

CROSS-REFERENCES TO RELATED APPLICATION

The present application claims priority under 35 U.S.C. § 119(a) to Korean application number 10-2016-0140347, filed on Oct. 26, 2016, in the Korean Intellectual Property Office, which is incorporated herein by reference in its entirety.

BACKGROUND

1. Technical Field

Various embodiments may generally relate to a semiconductor integrated circuit, and more particularly, to a semiconductor memory apparatus.

2. Related Art

Semiconductor memory apparatuses may be configured to store data and output the stored data.

Semiconductor memory apparatuses have been developed to store data faster and output the stored data faster due to a high speed of the semiconductor memory apparatuses.

SUMMARY

In an embodiment of the present disclosure, a semiconductor memory apparatus may include: a current sink circuit configured to allow a portion of a current flowing through a memory cell to flow to a negative voltage terminal in a read operation; and a sense amplifier configured to detect data of the memory cell and output a detection result in response to a sense amplifier enable signal in the read operation. The current sink circuit may vary an amount of the current flowing to the negative voltage terminal in response to the sense amplifier enable signal.

In another embodiment of the present disclosure, a semiconductor memory apparatus may include: a read voltage generation circuit configured to generate a read voltage and output the generated read voltage in response to a read signal; a first switch configured to couple the read voltage generation circuit and a memory cell in response to the read signal so that the read voltage is transferred to the memory cell; a second switch configured to couple the memory cell and a detection node in response to the read signal so that a current flowing through the memory cell is transferred to the detection node; a current sink circuit configured to allow a portion of a current flowing in the current sink circuit from the detection node to is flow to a negative voltage terminal and vary an amount of a current flowing from the current sink circuit to the negative voltage terminal in response to a sense amplifier enable signal; and a sense amplifier configured to detect a voltage level of the detection node and output a detection result in response to the sense amplifier enable signal.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present disclosure.

Figure 1:
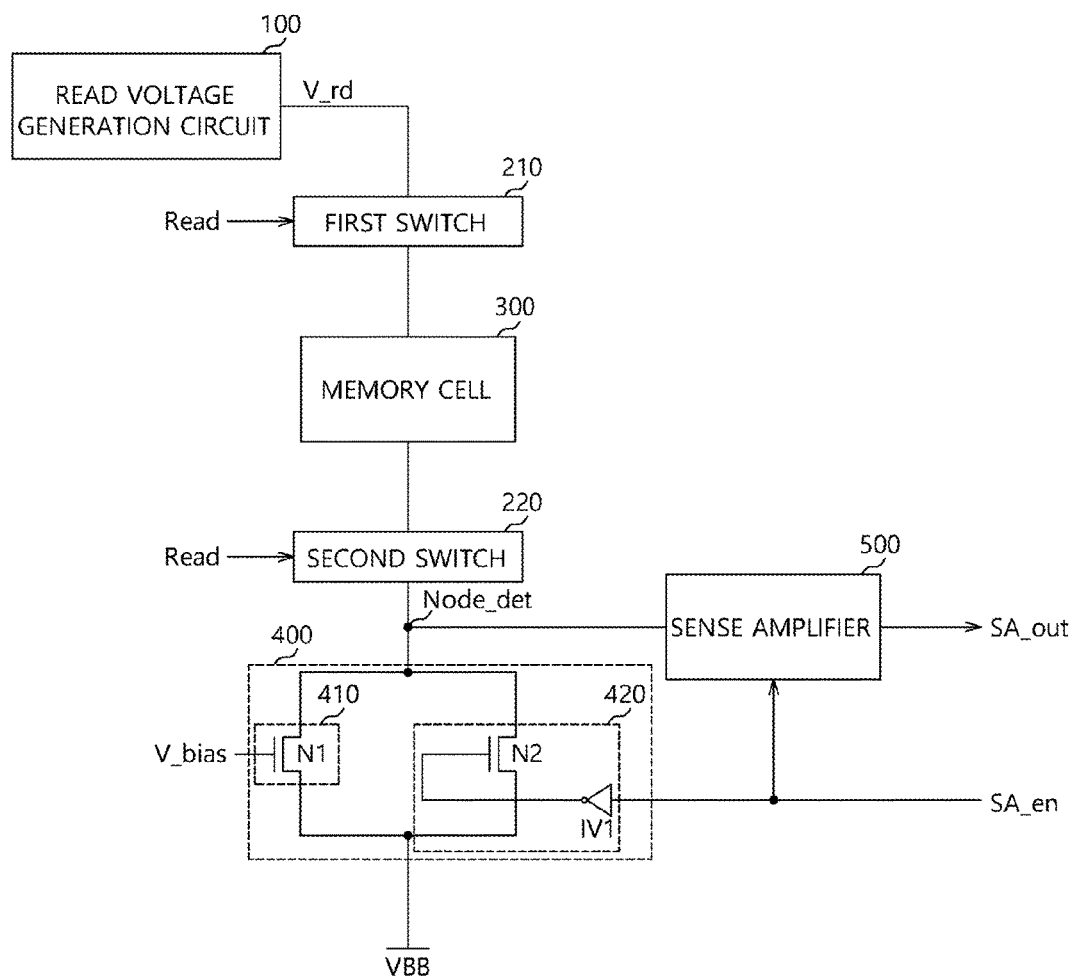
FIG. 1 is a configuration diagram illustrating a semiconductor memory apparatus according to an embodiment of the present disclosure.

As illustrated in FIG. 1, a semiconductor memory apparatus according to an embodiment may include a read voltage generation circuit 100, first and second switches 210 and 220, a memory cell 300, a current sink circuit 400, and a sense amplifier 500.

The read voltage generation circuit 100 may generate a read voltage V_rd and output the generated read voltage V_rd in a read operation.

The first switch 210 may turn on in the read operation and transfer the read voltage V_rd to the memory cell 300. For example, the first switch 210 may allow the read voltage V_rd to be transferred to the memory cell 300 or may prevent the read voltage V_rd from being transferred to the memory cell 300, in response to a read signal Read. In this example, the first switch 210 may turn on and transfer the read voltage V_rd to the memory cell 300 when the read signal Read is enabled. The first switch 210 may turn off and prevent the read voltage V_rd from being transferred to the memory cell 300 when the read signal Read is disabled. The first switch 210 may couple and separate the read voltage generation circuit 100 and the memory cell 300 in response to the read signal Read. The first switch 210 may couple the read voltage generation circuit 100 to the memory cell 300 when the read signal Read is enabled and may separate the read voltage generation circuit 100 from the memory cell 300 when the read signal Read is disabled.

The memory cell 300 may be a unit circuit of the semiconductor memory apparatus which stores data. A resistance level of the memory cell 300 may be changed according to a data value of data stored therein.

The second switch 220 may turn on in the read operation and transfer a current flowing from the memory cell 300 to the current sink circuit 400. For example, the second switch 220 may transfer the current flowing from the memory cell 300 to the current sink circuit 400 in response to the read signal Read. In this example, the second switch 220 may turn on and transfer the current flowing from the memory cell 300 to the current sink circuit 400 when the is read signal Read is enabled. The second switch 220 may turn off and prevent the current flowing from the memory cell 300 from being transferred to the current sink circuit 400 when the read signal Read is disabled. The second switch 220 may couple and separate the memory cell 300 and the current sink circuit 400 in response to the read signal Read. The second switch 210 may couple the current sink circuit 400 to the memory cell 300 when the read signal Read is enabled and may separate the current sink circuit 400 from the memory cell 300 when the read signal Read is disabled. A node in which the second switch 220 and the current sink circuit 400 are coupled may be referred to as a detection node Node_det. Further, a current flowing through the memory cell 300 may be transferred to the detection node Node_det.

The current sink circuit 400 may allow a fixed amount of current of the current flowing from the second switch 220 to flow to a negative voltage terminal VBB and may vary an amount of the current flowing to the negative voltage terminal VBB in response to a bias voltage V_bias and a sense amplifier enable signal SA_en.

The current sink circuit 400 may include a fixed sink circuit 410 and a variable sink circuit 420.

The fixed sink circuit 410 may allow a first fixed amount of current of the current flowing in the current sink circuit 400 from the second switch 220, for example the detection node Node_det, to flow to the negative voltage terminal VBB in response to a voltage level of the bias voltage V_bias.

The fixed sink circuit 410 may include a first transistor N1. A gate of the first transistor N1 may receive the bias voltage V_bias, the detection node Node_det may be coupled to a drain of the first transistor N1, and the negative voltage terminal VBB may be coupled to a source of the first transistor N1.

The variable sink circuit 420 may allow a second fixed amount of current of the current flowing in the current sink circuit 400 from the second switch 220, for example the detection node Node_det, to flow to the negative voltage terminal VBB or may interrupt the second fixed amount of current flowing to the negative voltage terminal VBB, in response to the sense amplifier enable signal SA_en. For example, the variable sink circuit 420 may interrupt the second fixed amount of current flowing from the detection node Node_det to the negative voltage terminal VBB when the sense amplifier enable signal SA_en is enabled. The variable sink circuit 420 may allow the second fixed amount of current to flow from the detection node Node_det to the negative voltage terminal VBB when the sense amplifier enable signal SA_en is disabled.

The variable sink circuit 420 may include a second transistor N2 and an inverter IV1. The inverter IV1 may receive the sense amplifier enable signal SA_en. A gate of the second transistor N2 may receive an output signal of the inverter IV1, the detection node Node_det may be coupled to a drain of the second transistor N2, and the negative voltage terminal VBB may be coupled to a source of the second transistor N2. Further, the current sink circuit 400, the sense amplifier 500, and the memory cell 300 may be commonly coupled to the detection node Node_det in the read operation.

The current sink circuit 400 may be configured in such a manner that both the fixed sink circuit 410 and the variable sink circuit 420 may allow a fixed amount of current to flow to the negative voltage terminal VBB when the sense amplifier enable signal SA_en is disabled, and only the fixed sink circuit 410 may allow a fixed amount of current to flow to the negative voltage terminal VBB when the sense amplifier enable signal SA_en is enabled. Accordingly, the current sink circuit 400 may be configured to allow a smaller amount of current to flow to the negative voltage terminal VBB when the sense amplifier enable signal SA_en is enabled than when the sense amplifier enable signal SA_en is disabled.

The sense amplifier 500 may detect the voltage level of the detection node Node_det and output the detection result as an output signal SA_out in response to the sense amplifier enable signal SA_en. For example, the sense amplifier 500 may be activated when the sense amplifier enable signal SA_en is enabled, detect the voltage level of the detection node Node_det, and output the detection result as the output signal SA_out. The activated sense amplifier 500 may determine a level of the output signal SA_out according to whether the voltage level of the detection node Node_det is larger or smaller than a target level. The sense amplifier 500 may be inactivated when the sense amplifier enable signal SA_en is disabled.

An operation of the semiconductor memory apparatus having the above-described configuration according to an embodiment will be described.

In the read operation, the read signal Read may be enabled.

In the read operation, the read voltage generation circuit 100 may generate the read voltage V_rd and output the generated read voltage V_rd in response to the read signal Read.

When the read signal Read is enabled, the first switch 210 may transfer the read voltage V_rd to the memory cell 300.

A resistance level of the memory cell 300 may be varied according to a level of data stored therein.

When the read signal Read is enabled, the second switch 220 may transfer the current flowing from the memory cell 300 to the current sink circuit 400.

The current sink circuit 400 may allow a portion of the current flowing from the second switch 220, for example the current flowing from the memory cell 300, to flow to the negative voltage terminal VBB, and the current sink circuit 400 may vary an amount of current flowing to the negative voltage terminal VBB of the current flowing from the memory cell 300 in response to the sense amplifier enable signal SA_en. The current sink circuit 400 may receive the current flowing through the memory cell 300 and may allow a smaller is amount of current to flow to the negative voltage terminal VBB when the sense amplifier enable signal SA_en is enabled than when the sense amplifier enable signal SA_en is disabled.

When the sense amplifier enable signal SA_en is enabled, the sense amplifier 500 may detect the voltage level of the detection node Node_det in which the second switch 220 and the current sink circuit 400 are coupled and output the detection result as the output signal SA_out in response to the sense amplifier enable signal SA_en in the read operation.

For example, in the read operation, that is, when the read signal Read is enabled, the first and second switches 210 and 220 may turn on, the read voltage V_rd may be applied to the memory cell 300, and the current sink circuit 400 may allow a portion of the current flowing through the memory cell 300 to flow to the negative voltage terminal VBB through the current sink circuit 400. When the sense amplifier enable signal SA_en is disabled, for example, when the sense amplifier 500 does not detect the voltage level of the detection node Node_det, both the fixed sink circuit 410 and the variable sink circuit 420 of the current sink circuit 400 may allow the fixed amount of current of the current flowing from the memory cell 300 to flow to the negative voltage terminal VBB and thus the voltage level of the detection node Node_det may be maintained to the target level or less. Accordingly, the sense amplifier 500 may quickly detect the resistance level of the memory cell 300 in the read operation. Subsequently, when the sense amplifier enable signal SA_en is enabled, the variable sink circuit 420 of the current sink circuit 400 may stop the flow of the fixed amount of current and only the fixed sink circuit 410 may allow a portion of the current flowing through the memory cell 300 to flow to the negative voltage terminal VBB. Accordingly, the current sink circuit 400 may allow a smaller amount of current to flow to the negative voltage terminal VBB when the sense amplifier enable signal SA_en is enabled than when the sense amplifier enable signal SA_en is disabled. For example, because a smaller amount of current flows from the current sink circuit 400 to the negative voltage terminal VBB when the sense amplifier enable signal SA_en is enabled than when the sense amplifier enable signal SA_en is disabled, the voltage level of the detection node Node_det may be raised to the target level according to a resistance level of the memory cell 300 faster than the related art. Because the voltage level of the detection node Node_det is raised to the target level or quicker than the related art, the sense amplifier 500 may determine the voltage level of the output signal SA_out quicker than the related art.

The semiconductor memory apparatus according to an embodiment may raise the voltage level of the detection node faster than the related art by varying the amount of current flowing from the detection node to the negative voltage terminal when the sense amplifier enable signal is enabled with respect to the amount of current flowing when the sense amplifier enable signal is disabled. Accordingly, data detection speed of the memory cell may be improved.

The above described embodiments of the present disclosure are intended to illustrate and not to limit the present disclosure. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

Figure 2:
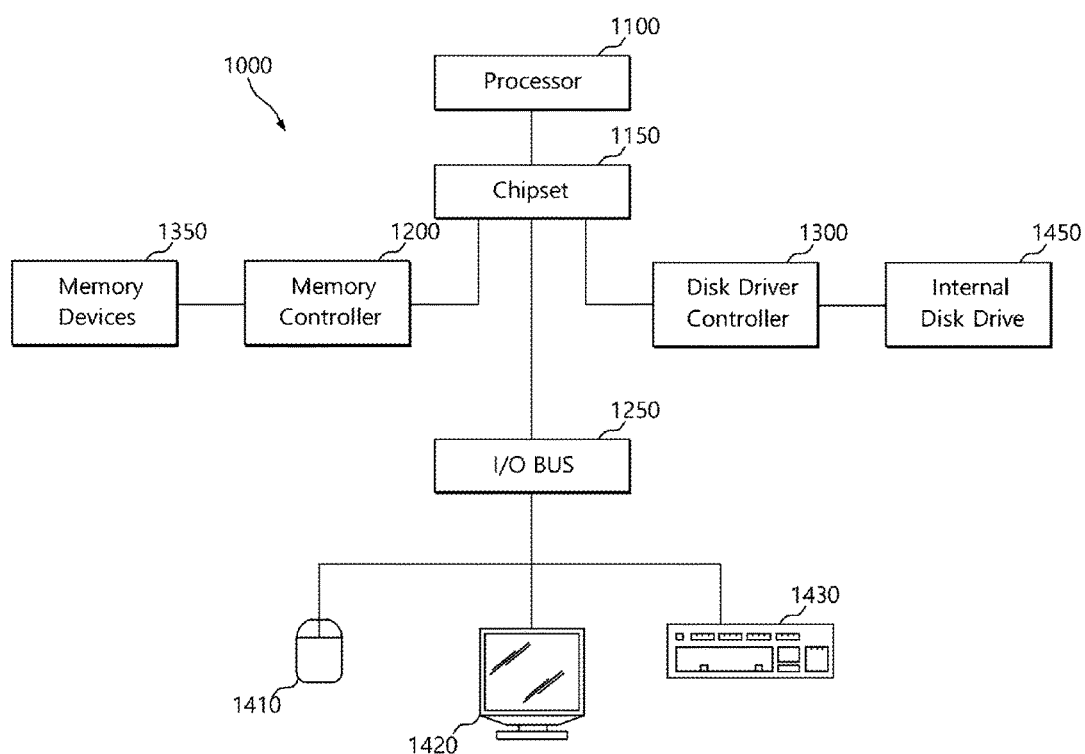
FIG. 2 illustrates a block diagram of a system employing a semiconductor memory apparatus in accordance with the various embodiments discussed above with relation to FIG. 1.

The semiconductor memory apparatus discussed above (see FIG. 1) is particularly useful in the design of memory devices, processors, and computer systems. For example, referring to FIG. 2, a block diagram of a system employing a semiconductor memory apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor memory apparatus as discussed above with reference to FIG. 1. Thus, the memory controller 1200 can receive a request provided from the processor (i.e., CPU) 1100, through the chipset 1150. In alternate embodiments, the memory controller 1200 may be integrated into the 1o chipset 1150. The memory controller 1200 may be operably coupled to one or more memory devices 1350. In an embodiment, the memory devices 1350 may include the at least one semiconductor memory apparatus as discussed above with relation to FIG. 1, the memory devices 1350 may include a plurality of word lines and a is plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually is any type of communication protocol, including, for example but not limited to, all of those mentioned above with regard to the I/O bus 1250.

It is important to note that the system 1000 described above in relation to FIG. 2 is merely one example of a system 1000 employing a semiconductor apparatus as discussed above with relation to FIG. 1. In alternate embodiments, such as, for example but not limited to, cellular phones or digital cameras, the components may differ from the embodiments illustrated in FIG. 2.

What is claimed is:

1. A semiconductor memory apparatus comprising:
    a current sink circuit configured to allow a portion of a current flowing through a memory cell to flow to a negative voltage terminal in a read operation; and a sense amplifier configured to detect data of the memory cell and output a detection result in response to a sense amplifier enable signal in the read operation, wherein the current sink circuit varies an amount of the current flowing to the negative voltage terminal in response to the sense amplifier enable signal, wherein the current sink circuit, the sense amplifier, and the memory cell are commonly coupled to the detection node in the read operation, wherein the current flowing through the memory cell in the read operation is transferred to the current sink circuit through the detection node, a portion of the transferred current flows to a negative voltage terminal through the current sink circuit, and the sense amplifier detects a voltage level of the detection node and outputs the detection result.

2. The semiconductor memory apparatus of claim 1, wherein the current sink circuit includes:

a fixed sink circuit configured to allow a first fixed amount of current of the current flowing in the current sink circuit from the detection node to flow to the negative voltage terminal in response to a voltage level of a bias voltage; and a variable sink circuit configured to allow a second fixed amount of current of the current flowing in the current sink circuit from the detection node to flow to the negative voltage terminal in response to the sense amplifier enable signal.

3. The semiconductor memory apparatus of claim 2, wherein the variable sink circuit interrupts the current flowing from the detection node to the negative voltage terminal when the sense amplifier enable signal is enabled and allows the current to flow from the detection node to the negative voltage terminal when the sense amplifier enable signal is disabled.

4. A semiconductor memory apparatus comprising:

a read voltage generation circuit configured to generate a read voltage and output the generated read voltage in response to a read signal;

a first switch configured to couple the read voltage generation circuit and a memory cell in response to the read signal so that the read voltage is transferred to the memory cell;

a second switch configured to couple the memory cell and a detection node in response to the read signal so that a current flowing through the memory cell is transferred to the detection node;

a current sink circuit configured to allow a portion of a current flowing in the current sink circuit from the detection node to flow to a negative voltage terminal and vary an amount of a current flowing from the current sink circuit to the negative voltage terminal in response to a sense amplifier enable signal; and a sense amplifier configured to detect a voltage level of the detection node and output a detection result in response to the sense amplifier enable signal.

5. The semiconductor memory apparatus of claim 4, wherein the current sink circuit allow a smaller amount of current to flow to the negative voltage terminal when the sense amplifier enable signal is enabled than when the sense amplifier enable signal is disabled.

6. The semiconductor memory apparatus of claim 5, wherein the current sink circuit includes:

a fixed sink circuit configured to allow a first fixed amount of current of the current flowing in the current sink circuit from the detection node to flow to the negative voltage terminal in response to a voltage level of a bias voltage; and a variable sink circuit configured to allow a second fixed amount of current of the current flowing in the current sink circuit from the detection node to flow to the negative voltage terminal in response to the sense amplifier enable signal.

7. The semiconductor memory apparatus of claim 6, wherein the variable sink circuit allows the current to flow from the detection node to the negative voltage terminal when the sense amplifier enable signal is disabled and interrupts the current flowing from the detection node to the negative voltage terminal when the sense amplifier enable signal is enabled.

8. The semiconductor memory apparatus of claim 6, wherein the fixed sink circuit includes a first transistor configured to receive the bias voltage.

9. The semiconductor memory apparatus of claim 6, wherein the variable sink circuit includes a second transistor and an inverter where the inverter is configured to receive the sense amplifier enable signal, and a gate of the second transistor is configured to receive an output signal of the inverter.

10. The semiconductor memory apparatus of claim 6, wherein a resistance level of the memory cell is changed according to a data value stored in the memory cell.

* * * * *